United States Patent
Berman et al.

(10) Patent No.: US 11,527,299 B2
(45) Date of Patent: Dec. 13, 2022

(54) POLAR NEURAL NETWORK DECODER FOR MEMORY DEVICES

(71) Applicant: SAMSUNG ELECTRONICS CO., LTD., Suwon-si (KR)

(72) Inventors: Amit Berman, Ramat-Gan (IL); Evgeny Blaichman, Tel Aviv (IL); Ron Golan, Shoham (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 262 days.

(21) Appl. No.: 16/891,565

(22) Filed: Jun. 3, 2020

(65) Prior Publication Data
US 2021/0383887 A1  Dec. 9, 2021

(51) Int. Cl.
| | |
|---|---|
| *G11C 29/42* | (2006.01) |
| *G06N 3/08* | (2006.01) |
| *G11C 16/08* | (2006.01) |
| *G11C 16/10* | (2006.01) |
| *G06F 17/18* | (2006.01) |

(52) U.S. Cl.
CPC .............. *G11C 29/42* (2013.01); *G06F 17/18* (2013.01); *G06N 3/08* (2013.01); *G11C 16/08* (2013.01); *G11C 16/10* (2013.01)

(58) Field of Classification Search
CPC ......... G11C 29/42; G11C 16/08; G11C 16/10; G06F 17/18; G06N 3/08
See application file for complete search history.

(56) References Cited

U.S. PATENT DOCUMENTS

| | | | |
|---|---|---|---|
| 2017/0126360 A1* | 5/2017 | Millar | H04L 1/0057 |
| 2020/0081768 A1* | 3/2020 | Barbato | H04L 1/0054 |
| 2020/0264974 A1* | 8/2020 | Ram | G11C 11/5642 |
| 2021/0149016 A1* | 5/2021 | Murakami | H04L 27/2602 |

OTHER PUBLICATIONS

Seo, et al., "Decoding of Polar Code by Using Deep Feed-Forward Neural Networks", 2018 Workshop on Computing, Networking and Communications (CNC), pp. 238-242.

* cited by examiner

*Primary Examiner* — Kyle Vallecillo
(74) *Attorney, Agent, or Firm* — F. Chau & Associates, LLC

(57) ABSTRACT

A method, apparatus, non-transitory computer readable medium, and system for using an error correction code in a memory device with a neural network are described. Embodiments of the method, apparatus, non-transitory computer readable medium, and system may receive a signal from a physical channel, wherein the signal is based on a modulated symbol representing information bits encoded using an error correction coding scheme, extract features from the signal using a feature extractor trained using probability data collected from the physical channel, and decode the information bits with a neural network decoder taking the extracted features as input.

15 Claims, 8 Drawing Sheets

POLAR NEURAL NETWORK DECODER FOR MEMORY DEVICES

BACKGROUND

The following relates generally to decoding an error correction code with a neural network, and more specifically to decoding an error correction code with a neural network in memory devices.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

In some cases, data may be encoded prior to programming to a memory device in order to provide the ability to correct for read errors. A polar coding scheme is an example of an efficient error correction code (ECC) scheme. However, many decoders assume an additive white Gaussian noise (AWGN) model, but the noise introduce by Flash memory cells may not be consistent with an AWGN model. Furthermore, decoding a polar decoding scheme can be computationally intensive. Therefore, there is a need in the art for improved systems and methods for decoding information stored in a memory device.

SUMMARY

A method, apparatus, non-transitory computer readable medium, and system for decoding an error correction code with a neural network are described. Embodiments of the method, apparatus, non-transitory computer readable medium, and system may receive a signal from a physical channel, wherein the signal is based on a modulated symbol representing information bits encoded using an error correction coding scheme, extract features from the signal using a feature extractor trained using probability data collected from the physical channel, and decode the information bits with a neural network decoder taking the extracted features as input.

A method, apparatus, non-transitory computer readable medium, and system for decoding an error correction code with a neural network are described. Embodiments of the method, apparatus, non-transitory computer readable medium, and system may prepare a labeled training set comprising ground truth information bits and voltage levels read from a memory device, wherein the voltage levels are based on encoding the ground truth information bits and programming the encoded ground truth information bits to the memory device using a set of modulation symbols, identify a plurality of conditional probability mass functions based on the labeled training set, wherein each of the conditional probability mass functions describes a voltage level probability for one of the set of modulation symbols, read a voltage level from a memory device, extract features from the voltage levels based at least in part on the conditional probability mass functions, apply a neural network decoder to the features to produce predicted information bits, compare the predicted information bits to the ground truth information bits, and update the neural network decoder based on the comparison.

A memory device and method for decoding an error correction code with a neural network are described. Embodiments of the memory device and method may a plurality of memory cells configured to store encoded information bits, a feature extractor configured to extract features from read voltage levels based on probability data collected for the memory device, and a neural network decoder configured to decode the encoded information using the extracted features as input.

BRIEF DESCRIPTION OF THE DRAWINGS

Features of the present inventive concept will become more apparent by describing in detail exemplary embodiments thereof with reference to the accompanying drawings.

DETAILED DESCRIPTION

Figure 1:
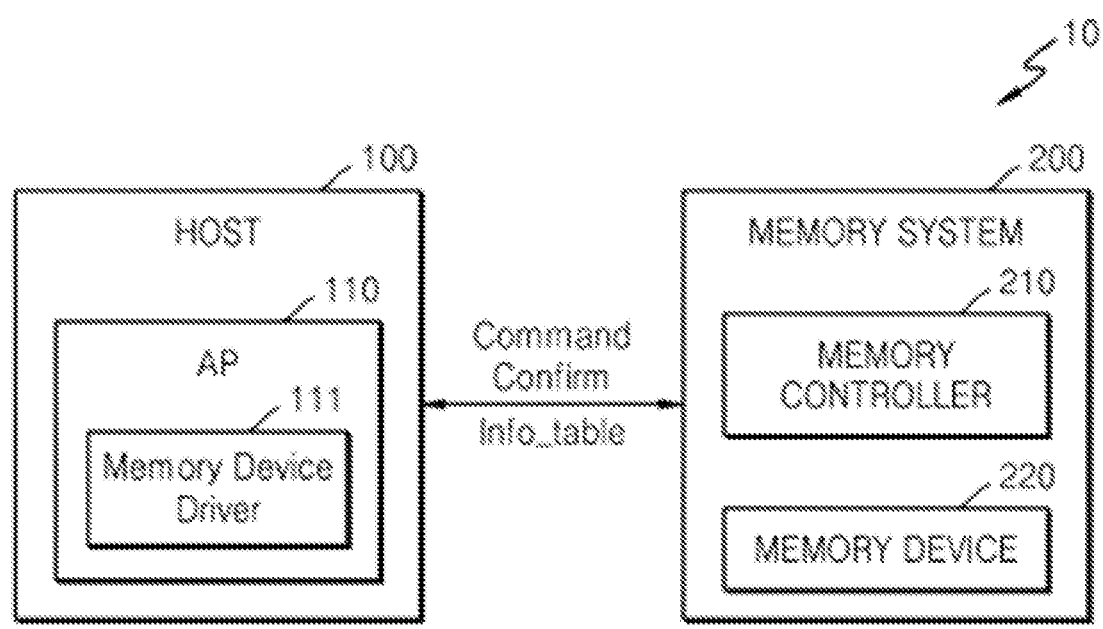
FIG. 1 is a block diagram illustrating an implementation of a data processing system including a memory system, according to an exemplary embodiment of the inventive concept.

The present disclosure describes systems and methods for error correction, and more specifically for decoding an error correction code with a neural network.

The present disclosure describes system and methods for decoding an error correction code with a neural network, and more specifically in memory devices.

NAND programming is a complex process based on applying a voltage to a memory cell. However, cell voltage may be affected by variables such as current voltage level, pulse power, and inter cell interferences. Cell voltage may also be affected by inhibited cell disruption, inter word-line (WL) coupling, and cell retention. Additionally, the outcome of writing to a NAND device is stochastic. For example, data may also be noisy, leading to problems with observation.

A decoder is a logic circuit used to convert binary information from coded inputs to unique outputs. Multiple inputs and multiple outputs may be used. Channel coding performs and encoding and decoding operations on a data stream to correct communication errors such as interference or noise. Channel coding is performed on a first data stream with a first set of operations at a transmitting device and a second data stream with a second set of operations at a receiving device. Channel coding may be a block code or a convolutional code.

Polar codes are a subset of channel coding. Polar coding is a block code method, where a block of data and bits have a set size. A manipulation to the block is performed at the transmitter and receiver. Operations called Channel Combining and Channel Splitting are performed. First, Channel Combining assigns and/or maps combinations of symbols to channels. Then, Channel Splitting performs a transformation operation, translating symbol combinations into time domain vectors used in the decoder. The decoding operation, with the encoding operation, estimates time domain bit streams. This converts the block of bits and channels into a polarized bit stream at the receiver.

Polar codes have been shown to achieve capacity for Additive white Gaussian noise (AWGN) channels and achieve comparable performance to Low-density parity-check code (LDPC) for finite length code using a Successive Cancelation List (SCL) decoder with cyclic redundancy checks (CRC). The SCL decoder has a high latency because each bit is decoded successively. A Neural Network (NN) decoder can be used in Polar codes. A neural network decoder performs similarly to the SCL decoder for relatively short codes. The decoding of the neural network decoder is performed with very low latency, because all the bits are decoded in parallel.

The Neural network decoder of the present disclosure may be used for AWGN channels with Binary Phase Shift Keying (BPSK) modulation. However, many Flash memory channels do not utilize AWGN channels and embodiments of the disclosure do not necessarily assume AWGN channels. Multiple bits per cell may be stored, so the modulation can be pulse amplitude modulation (PAM). For example, 4 PAM may be used for 2 bits per cell and 8 PAM is used for 3 bits per cell.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Exemplary Memory System

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
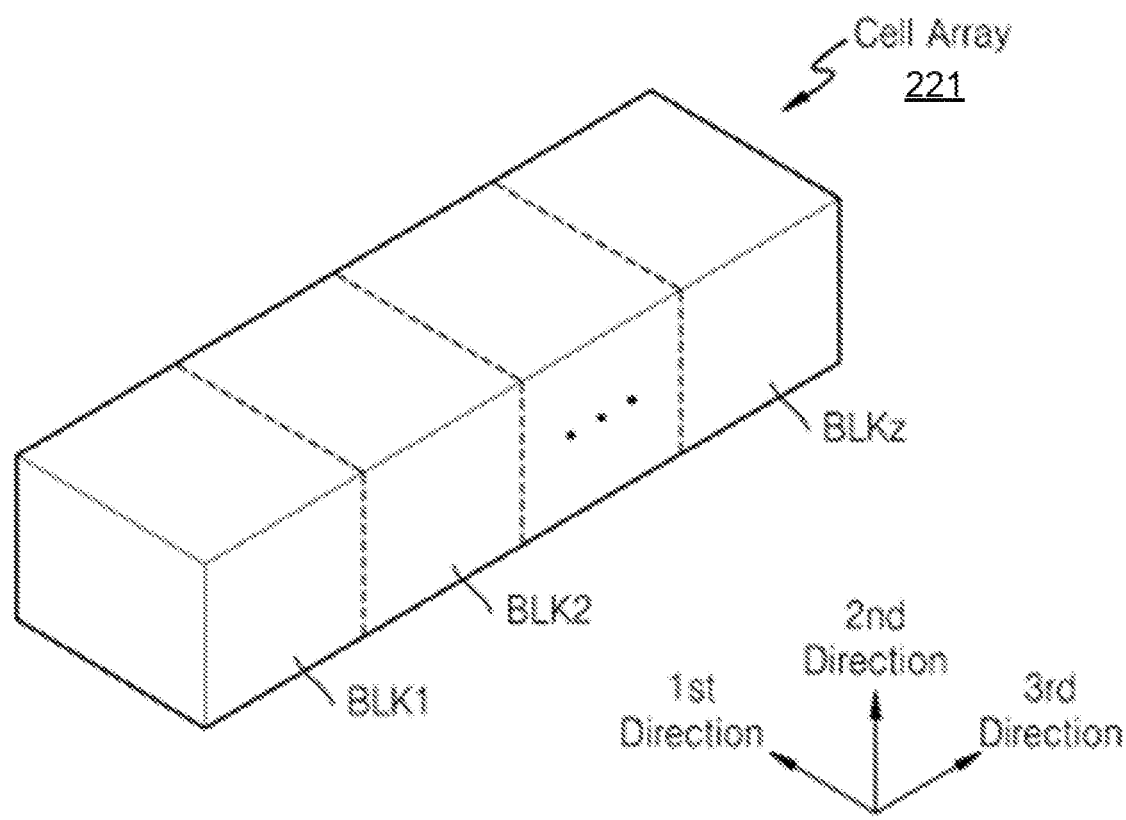
FIG. 4 is a block diagram of the memory cell array of FIG. 2, according to an exemplary embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
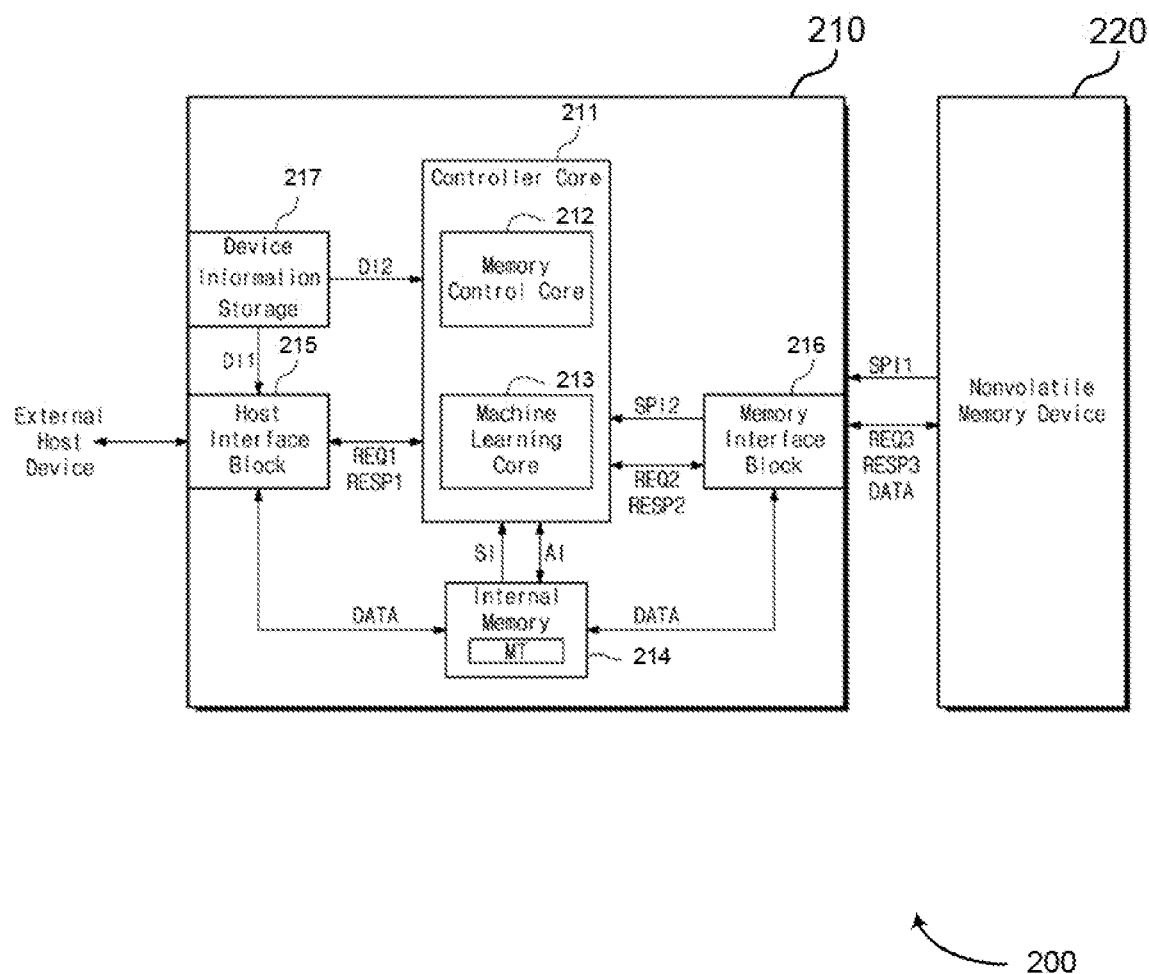
FIG. 2 is a block diagram illustrating the memory system of FIG. 1, according to an exemplary embodiment of the inventive concept.

FIG. 2 is a block diagram illustrating the memory system 200 of FIG. 1, according to an exemplary embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216.

The controller core 211 may include a memory control core 212 and a machine learning core 213, and each of these cores may be implemented by one or more processors. The memory control core 212 may control and access the memory device 220 depending on a request received from the host 100 or an internally designated schedule. The memory control core 212 may manage and execute various metadata and codes used to manage or operate the memory system 200.

The machine learning core 213 may be used to perform training and inference of a neural network that is designed to perform noise cancellation on the memory device 220, as described in further detail below.

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

In an exemplary embodiment, a neural network may be included in a computer program which is stored in the internal memory 214 of the memory controller 210 or in the memory device 220. The computer program including the neural network may be executed by the machine learning core 213 to denoise data stored in the memory device 220. Thus, according to exemplary embodiments, the memory system 200 may denoise the data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be denoised using the neural network locally stored and executed in the memory system 200, and the denoised data may be read out from the memory device 220.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core 212 with a first request REQ1 received from the host 100. The first request REQ1 may include a command (e.g., a read command or a write command) and a logical address. The memory control core 212 may translate the first request REQ1 to a second request REQ2 suitable for the memory device 220.

For example, the memory control core 212 may translate a format of the command. The memory control core 212 may obtain address information AI with reference to the mapping table MT stored in the internal memory 214. The memory control core 212 may translate a logical address to a physical address of the memory device 220 by using the address information AI. The memory control core 212 may provide the second request REQ2 suitable for the memory device 220 to the memory interface block 216.

The memory interface block 216 may register the second request REQ2 from the memory control core 212 at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core 212 with a second response RESP2 indicating that the data is completely written.

After the data is stored in the internal memory 214 or after the second response RESP2 is received, the memory control core 212 may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core 212 with the second response RESP2 indicating that the data is completely stored. As the second response RESP2 is received, the memory control core 212 may transmit the first response RESP1 to the host 100 through the host interface block 215.

The host interface block 215 may transmit data stored in the internal memory 214 to the host 100. In an exemplary embodiment, in the case in which data corresponding to the first request REQ1 is stored in the internal memory 214, the transmission of the second request REQ2 and the third request REQ3 may be omitted.

Figure 3:
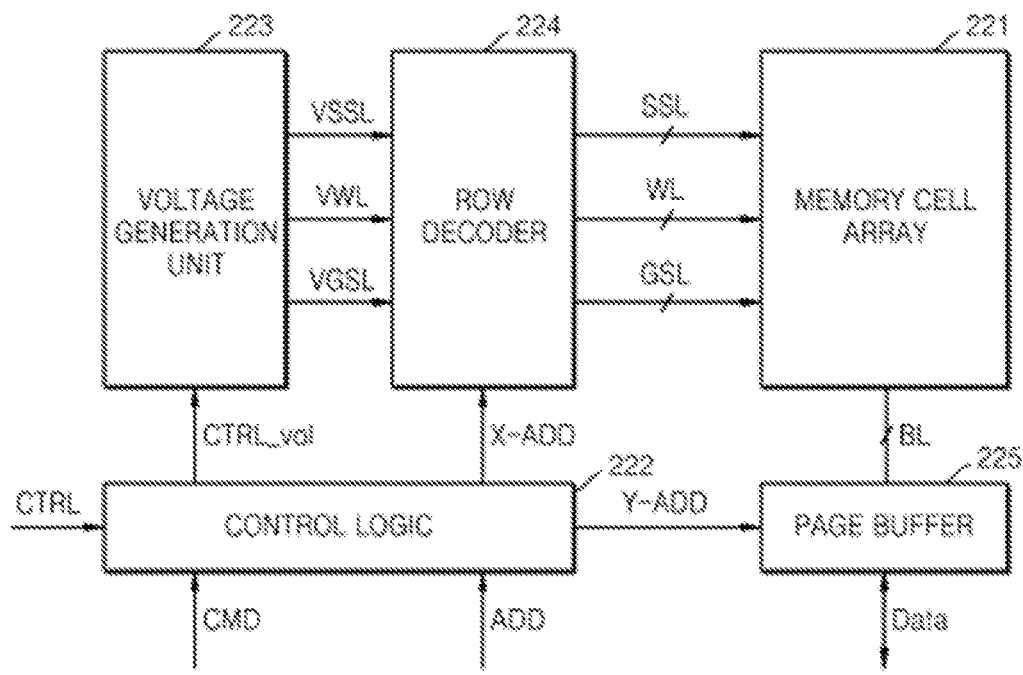
FIG. 3 is a detailed block diagram of a non-volatile memory device of FIG. 1, according to an exemplary embodiment of the inventive concept.

FIG. 3 is a detailed block diagram of the non-volatile memory device 220 of FIG. 1, according to an exemplary embodiment of the inventive concept. Referring to FIG. 2, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
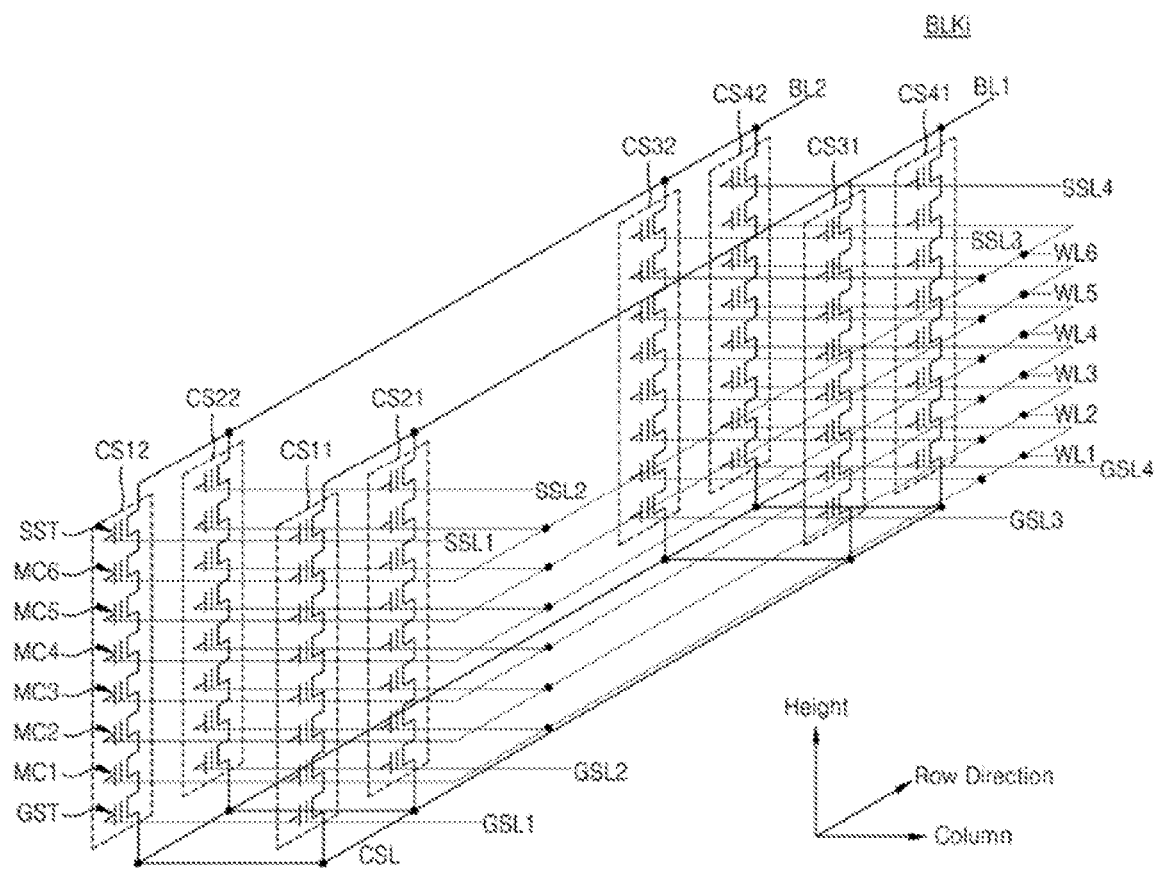
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4. Although FIG. 5 illustrates an examples with 6 wordlines and memory cells, this is just an illustration and any number of wordlines and memory cells may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Neural Network Decoder

Figure 6:
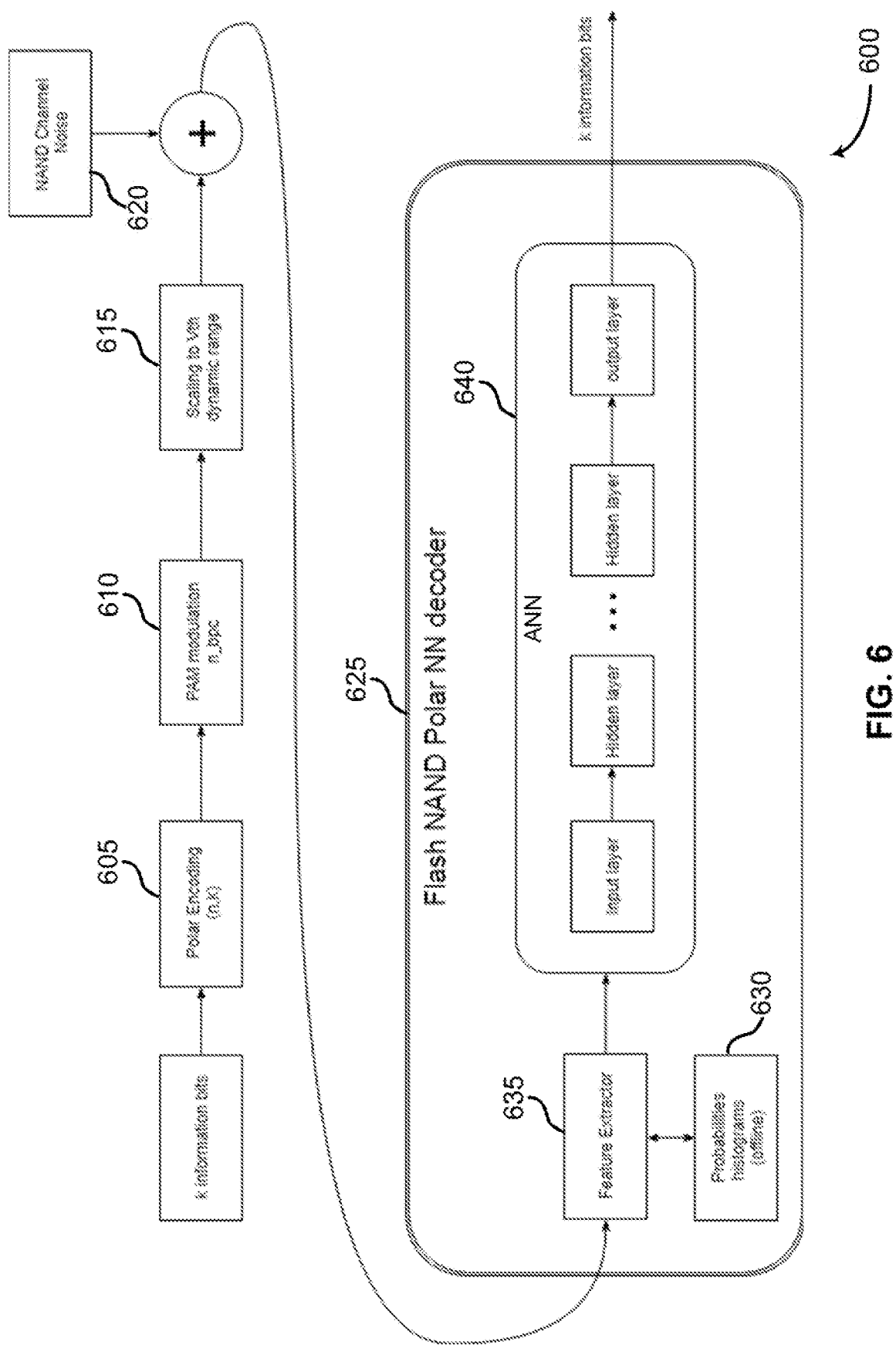
FIG. 6 shows an example of a memory device including a neural network decoder according to aspects of the present disclosure.

FIG. 6 shows an example of a memory device 600 including a neural network decoder 625 according to aspects of the present disclosure. Embodiments of the present disclosure uses a Flash polar neural network decoder.

Memory device 600 may store information for various programs and applications on a computing device. For example, the storage may include data for running an operating system. The memory may include both volatile memory and non-volatile memory. Volatile memory may include random access memory (RAM), and non-volatile memory may include read-only memory (ROM), flash memory, electrically erasable programmable read-only memory (EEPROM), digital tape, a hard disk drive (HDD), and a solid state drive (SSD). Memory may include any combination of readable and/or writable volatile memories and/or non-volatile memories, along with other possible storage devices.

According to one embodiment, the neural network decoder 625 comprises a multi-layer perceptron (MLP). An MLP is a feed forward neural network that typically consists of multiple layers of perceptrons. Each component perceptron layer may include an input layer, one or more hidden layers, and an output layer. Each node may include a nonlinear activation function. An MLP may be trained using backpropagation (i.e., computing the gradient of the loss function with respect to the parameters).

According to various embodiments, memory device 600 may receive a signal from a physical channel, where the signal is based on a modulated symbol representing information bits encoded using an error correction coding scheme. In some examples, the physical channel includes a NAND memory device 600. Memory device 600 may also detect voltage levels from the NAND memory device 600, where the detected voltage levels include a noisy realization of the modulated symbol.

In some examples, the modulated symbol includes channel input to the NAND memory device 600, and the signal includes a channel output from the NAND memory device 600. Memory device 600 may also program test symbols to the NAND memory, and detect voltage levels of the NAND memory, where the probability data is based on a conditional probability of detecting the voltage levels given each of the test symbols.

Thus, memory device 600 may read a voltage level from a memory device 600. In some examples, the voltage level read from the memory device 600 corresponds to a noisy version of a symbol from the set of modulated symbols. Memory device 600 may include encoder 605, modulation component 610, scaling component 615, memory cells 620, and decoder 625.

Encoder 605 may encode the information bits using an error correction coding scheme. During training, encoder 605 may encode the ground truth information bits using an error correction coding scheme. In some examples, the error correction coding scheme includes a polar encoding scheme. Encoder 605 may comprise an encoding component configured to encode information bits to produce the encoded information bits.

Error correction coding (ECC) and decoding operations may be performed on a data stream to correct communication errors such as interference or noise. A polar code is a linear block error correcting code based on a multiple recursive concatenation of a short kernel code which transforms the physical channel into multiple virtual outer channels. The virtual channels tend to either have high reliability or low reliability (i.e., they polarize). Data bits are allocated to the most reliable channels, and unreliable channels are "frozen" or set to 0.

Modulation component 610 may apply a modulation scheme to the encoded information bits to produce the modulated symbol. For example, program voltage selection of a cell may be performed by a pulse amplitude modulation (PAM) modulation algorithm where coded bits are divided to groups of a number of bits per cell. For example, in triple level cells (TLC), the number of bits per cell is 3. Each group of cells is called a symbol. For example, a symbol with bits 010 is equal to 2. For N-bits per cell, the Vth dynamic range is divided to $2^N$ target voltages. For 3-bits per cell, the Vth dynamic range is divided to 8 target voltages. Each target voltage is mapped to a symbol using Grey code, where only a single bit change between adjacent target voltages. For example, if the dynamic range is between −3V and 4V, a modulation of −3V is 111, −2V is 110, −1V is 100, 0V is 101, 1V is 001, 2V is 000, 3V is 010, and 4V is 011 may be used.

Scaling component 615 may be configured to scale output of the modulation component 610 based on a dynamic voltage range of the memory cells 620. Memory cells 620 may be configured to store encoded information bits as described above with reference to FIGS. 1-5.

Decoder 625 may decode the information bits with a neural network decoder 625 taking the extracted features as input. In some examples, the error correction coding scheme includes a polar encoding scheme. In some examples, the modulated symbol is based on a phase-amplitude modulation (PAM) scheme or a binary phase shift keying (BPSK) modulation scheme.

Decoder 625 may include probability information 630, feature extractor 635, and ANN 640. Feature extractor 635 may extract features from the signal using a feature extractor 635 trained using probability data collected from the physical channel. In some examples, the probability data collected from the physical channel includes one or more probability mass functions. In some examples, the probability data does not assume an additive Gaussian white noise (AWGN) model.

Feature extractor 635 may identify a set of conditional probability mass functions based on the labeled training set, where each of the conditional probability mass functions describes a voltage level probability for one of the set of modulation symbols. Feature extractor 635 may also extract features from the voltage levels based on the conditional probability mass functions. Thus, feature extractor 635 may be configured to extract features from read voltage levels based on probability data collected for the memory device 600.

Embodiments of the neural network decoder 625 include an artificial neural network (ANN). An ANN is a hardware or a software component that includes a number of connected nodes (a.k.a., artificial neurons), which may loosely correspond to the neurons in a human brain. Each connection, or edge, may transmit a signal from one node to another (like the physical synapses in a brain). When a node receives a signal, it can process the signal and then transmit the processed signal to other connected nodes. In some cases, the signals between nodes comprise real numbers, and the output of each node may be computed by a function of the weighted-sum of its inputs. Each node and edge may be associated with one or more node weights that determine how the signal is processed and transmitted.

During the training process, these weights may be adjusted to improve the accuracy of the result (i.e., by minimizing a loss function which corresponds in some way to the difference between the current result and the target result). The weight of an edge may increase or decrease the strength of the signal transmitted between nodes. In some cases, nodes may have a threshold below which a signal is not transmitted at all. The nodes may also be aggregated into layers. Different layers may perform different transformations on their inputs. The initial layer may be known as the input layer and the last layer may be known as the output layer. In some cases, signals may traverse certain layers multiple times.

Decoding Process

Figure 7:
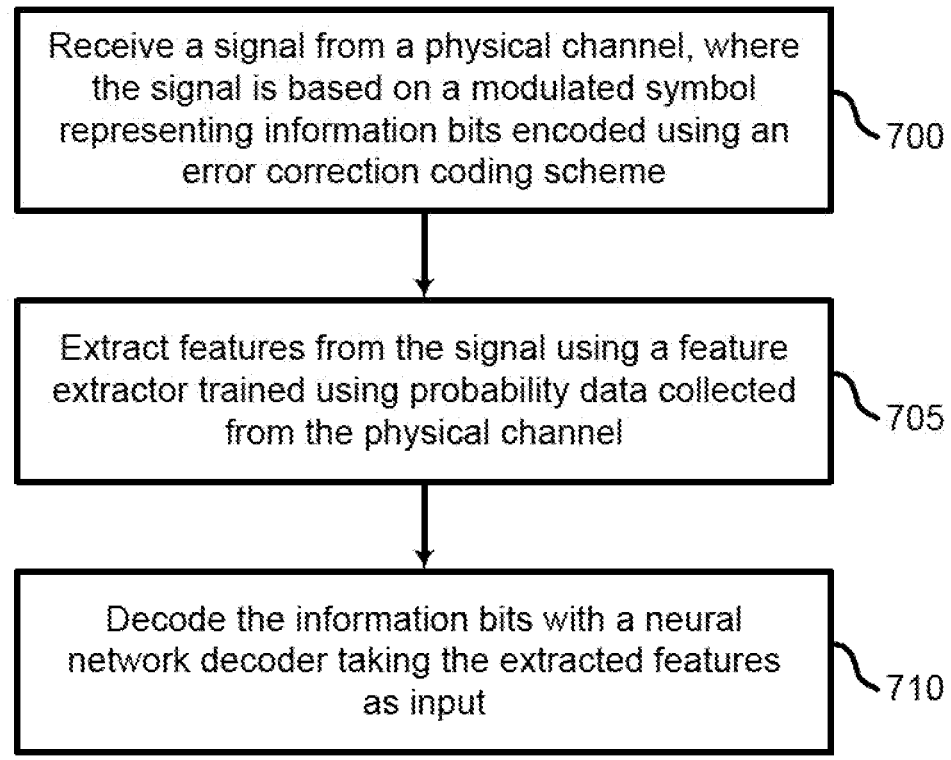
FIG. 7 shows an example of a process for decoding an error correction code with a neural network according to aspects of the present disclosure.

FIG. 7 shows an example of a process for decoding an error correction code with a neural network according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 700, the system receives a signal from a physical channel, where the signal is based on a modulated symbol representing information bits encoded using an error correction coding scheme. In some cases, the operations of this step may refer to, or be performed by, a memory device as described with reference to FIG. 6.

For n-bits per cell ($n_{bpc}$) memory device and code length n, a code-word is stored in $$n_{cells} = ceil\left(\frac{n}{n_{bpc}}\right)$$

memory cells. Each cell j has a voltage reading $V_j$. For each cell $2^{n\_bpc}$ histograms $P(V_j|L_i)$ are created offline, and evaluated online, while $L_i$ is the i-th level i∈{0, 1, . . . $2^{\hat{}}$n_bpc−1}, j∈{1, 2, . . . $n_{cells}$}. Here and throughout the present disclosure, the term "level" may be used in a general sense as an example of a symbol. For example, the level may refer to a combination of voltage levels across one or more cells.

The Feature extractor computes n_cells*$2^{n\_bpc}$ probabilities $\{P(V_j|L_i)\}$ j=1:n_cells; i=0:$2^{\hat{}}$n_bpc−1. Additionally, the feature extractor computes a wordline index, a P/E cycle index, retention time, and a pillar index. The probabilities may be evaluated using histograms, where the histograms are computed off-line.

At operation 705, the system extracts features from the signal using a feature extractor trained using probability data collected from the physical channel. In some cases, the operations of this step may refer to, or be performed by, a feature extractor as described with reference to FIG. 6.

Feature extraction may be an online process (i.e., performed when data is to be read from memory), where given a new measurement $V_j$, $V_j$ is quantized to a voltage bin $B_m$ according to the voltage value, where m∈{1, 2, . . . M} Each bin represents all the voltage measurements between some lower and upper bounds: $B_{m-1} \leq V_j < B_m$. The number of bins, M is configurable and defines the voltage resolution. Voltage $V_j$ is evaluated in $2^{n\_bpc}$ probability mass functions, and a vector of $2^{n\_bpc}$ elements [$P(V_j \in B_m|L_0)$, $P(V_j \in B_m|L_i)$, . . . $P(V_j \in B_m|L_{\{2^{n\_bpc}-1\}})$] is produced. Each element is a scalar number. The feature vector is the input to the predictive model (neural network).

Histogram values can be normalized before being used such that every bin does not represent a simple count (i.e. how many samples in the train set fell in that bin given a specific symbol). Rather, representing a ratio between that count and the total count (i.e. a number of samples given a specific symbol). This normalization will create a probability vector of M elements its sum will be 1.

The train set collection and the probability mass function creation processes are performed once and offline, the feature extraction is repeatedly performed online. The raw voltage measurement $V_j$ and the probability mass function vector may be used to create a new $2^{n\_bpc}+1$ elements feature vector.

At operation 710, the system decodes the information bits with a neural network decoder taking the extracted features as input. In some cases, the operations of this step may refer to, or be performed by, a decoder as described with reference to FIG. 6.

Decoder Training

Figure 8:
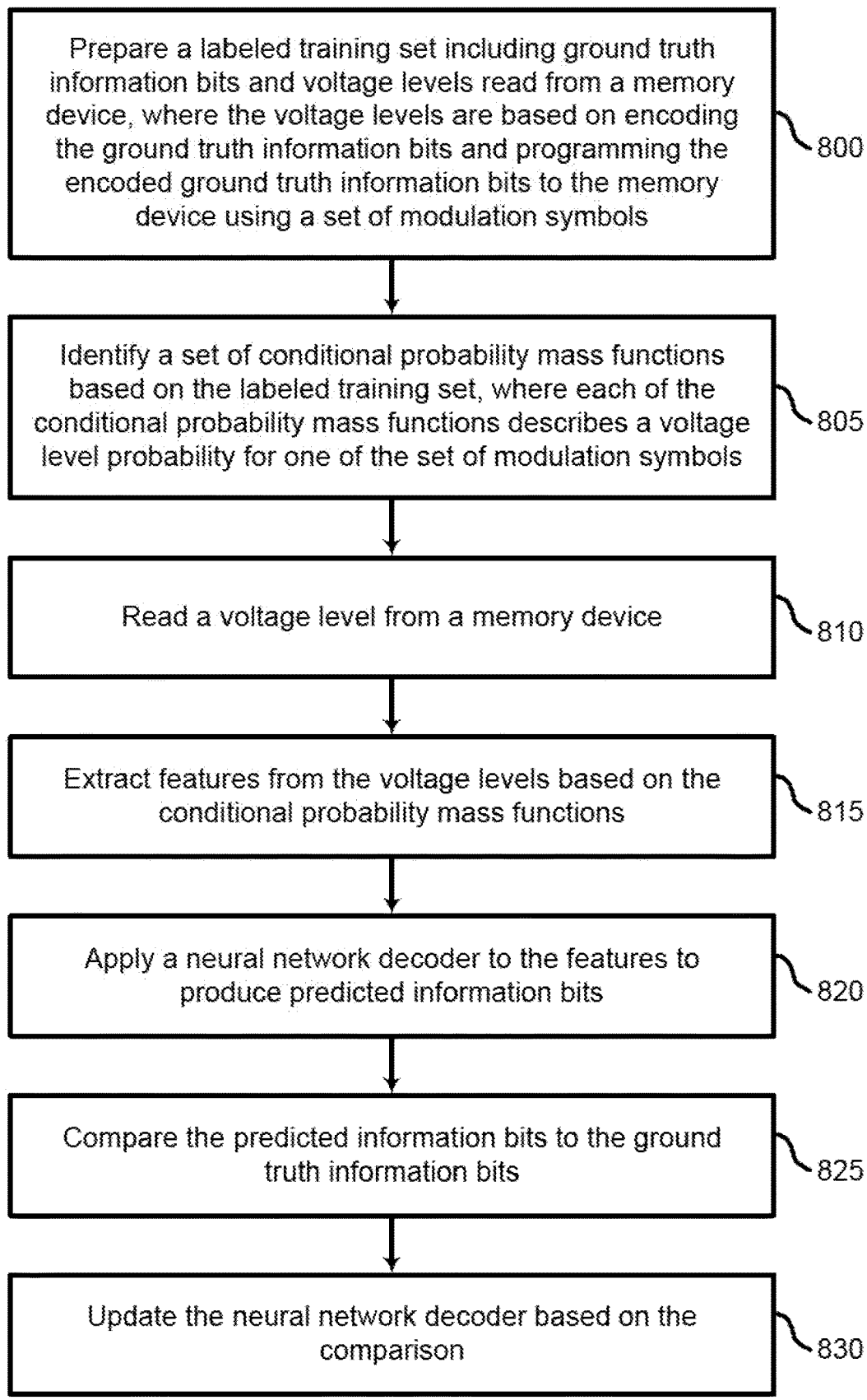
FIG. 8 shows an example of a process for training a neural network for decoding an error correction code according to aspects of the present disclosure.

FIG. 8 shows an example of a process for decoding an error correction code with a neural network according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

Training of a decoder may be described according to the following algorithm:

Let $FPD_\theta$ represent the neural network

Let $\widehat{info}$ represent $FPD_\theta(f)$

Let info represent the information bits mini-batch per network use

Let $\widetilde{\text{info}}$ represent the estimated information bits

Let f represent a feature vector computed using a feature extractor

Let $\lambda_\theta$ represent the learning rate

Initialize a parameter vector $\theta$ for each iteration do $\theta \leftarrow \theta - \lambda_\theta \nabla_\theta \text{CrossEntropy}(\text{info}, \widetilde{\text{info}})$ end for Thus, at operation 800, the system prepares a labeled training set including ground truth information bits and voltage levels read from a memory device, where the voltage levels are based on encoding the ground truth information bits and programming the encoded ground truth information bits to the memory device using a set of modulation symbols. In some cases, the operations of this step may refer to, or be performed by, a training component.

At operation 805, the system identifies a set of conditional probability mass functions based on the labeled training set, where each of the conditional probability mass functions describes a voltage level probability for one of the set of modulation symbols. In some cases, the operations of this step may refer to, or be performed by, a feature extractor as described with reference to FIG. 6.

At operation 810, the system reads a voltage level from a memory device. In some cases, the operations of this step may refer to, or be performed by, a memory device as described with reference to FIG. 6.

At operation 815, the system extracts features from the voltage levels based on the conditional probability mass functions. In some cases, the operations of this step may refer to, or be performed by, a feature extractor as described with reference to FIG. 6.

At operation 820, the system applies a neural network decoder to the features to produce predicted information bits. In some cases, the operations of this step may refer to, or be performed by, a decoder as described with reference to FIG. 6.

At operation 825, the system compares the predicted information bits to the ground truth information bits. In some cases, the operations of this step may refer to, or be performed by, a training component.

At operation 830, the system updates the neural network decoder based on the comparison. In some cases, the operations of this step may refer to, or be performed by, a training component.

For set collection training, which may be an offline process, information bits $\{b_j\}$ are generated. The information bits are then encoded to codewords $\{c_j\}$. Codewords are then grouped and modulated to a symbol $\{S_j\}$. The symbol is then programmed to a NAND cell and the cell's voltage $\{V_j\}$ is then read. For each cell, a pair $(V_j, S_j)$ is logged, where $V_j$ is the read voltage and $S_j$ is the symbol programmed to the voltage.

To create a probability mass function, which may also be an offline process, voltage dynamic range of the train-set pairs $(V_j, S_j)$ are split into bins. Each bin represents all the voltage measurements between some lower and upper bounds: $B_{m-1} \leq V_j < B_m$, where j is a sample index, and m is the bin index. $1 \leq m \leq M$. The number of bins M is configurable and set the voltage resolution. For $S_0$ of the probability mass function, train-set pairs with $S_j=0$ are gathered to produce the conditional probability mass function (histogram) of $P(V|S_0)$. This denotes a number of voltage measurements in a specific $B_m$ for each bin given that a cell was programmed to $S_0$. The length of the probability mass function vector is represented by the number of voltage bins, M.

For S1 of the probability mass function, train-set pairs with $S_j=1$ are gathered to produce the conditional probability mass function (histogram) of $P(V|S_1)$. This denotes the number of voltage measurements in a specific bin $B_j$ for each bin given the cell was programmed to $S_1$.

The process is continued until $S_{\{2^{n\_bpc}-1\}}$, where n_bpc is the number of bits per cell . . . . As a result, there are $2^{n\_bpc}$ probability mass functions, each is a vector of size M.

Thus, rather than using raw voltages supplied to the decoder, faster and more accurate convergence can be achieved by providing likelihood probabilities of voltage measurement, where each possible logical level is given.

For example, using a (7,8) code with 3 bits/cell. Using a vanilla voltage decoder (VV decoder), each codeword is stored in 3 cells therefore, the vanilla decoder is provided by 3 voltages. As an alternative, A Likelihood voltage decoder (LV decoder) is provided by 24 values, thereby using the voltage distribution in every level. The histograms will be created offline, and evaluated exactly on the voltage measurements during train/test time.

The histograms consider additional data such as wordline index, P/E cycle index, retention time, and Pillar index. Some additional data may not be available in practice. Therefore, the histograms may be created as part of an offline preprocessing stage before training and test time. This information may already be created by the LLR decoder in order to calculate the LLR per bit, so both decoders may share the same statistics. Another variant of this feature vector, called a Log likelihood voltage decoder (LLV decoder) may consider the log likelihood probabilities.

Accordingly, the present disclosure presents a neural network decoder that may be used for a flash memory scenario. The feature extractor module reduces the convergence time compared to a raw input of noised signal. Example architectures of the neural network decoder use PAM modulation, or may be designed for BPSK modulation. The histogram probabilities increase the decoder coverage for a NAND channel, or for an AWGN channel.

The present disclosure includes the following embodiments.

A method for decoding an error correction code with a neural network is described. Embodiments of the method may receiving a signal from a physical channel, wherein the signal is based on a modulated symbol representing information bits encoded using an error correction coding scheme, extracting features from the signal using a feature extractor trained using probability data collected from the physical channel, and decoding the information bits with a neural network decoder taking the extracted features as input.

An apparatus for decoding an error correction code with a neural network is described. The apparatus may include a processor, memory in electronic communication with the processor, and instructions stored in the memory. The instructions may be operable to cause the processor to receive a signal from a physical channel, wherein the signal is based on a modulated symbol representing information bits encoded using an error correction coding scheme, extract features from the signal using a feature extractor trained using probability data collected from the physical channel, and decode the information bits with a neural network decoder taking the extracted features as input.

A non-transitory computer readable medium storing code for decoding an error correction code with a neural network is described. In some examples, the code comprises instructions executable by a processor to: receive a signal from a physical channel, wherein the signal is based on a modulated symbol representing information bits encoded using an error correction coding scheme, extract features from the signal using a feature extractor trained using probability data collected from the physical channel, and decode the information bits with a neural network decoder taking the extracted features as input.

In some examples, the physical channel comprises a NAND memory device.

Some examples of the method, apparatus, non-transitory computer readable medium, and system described above may further include detecting voltage levels from the NAND memory device, wherein the detected voltage levels comprise a noisy realization of the modulated symbol.

In some examples, the modulated symbol comprises channel input to the NAND memory device, and the signal comprises a channel output from the NAND memory device.

In some examples, the probability data collected from the physical channel comprises one or more probability mass functions.

In some examples, the probability data does not assume an additive white Gaussian noise (AWGN) model.

Some examples of the method, apparatus, non-transitory computer readable medium, and system described above may further include programming test symbols to the NAND memory device. Some examples may further include detecting voltage levels of the NAND memory device, wherein the probability data is based on a conditional probability of detecting the voltage levels given each of the test symbols.

Some examples of the method, apparatus, non-transitory computer readable medium, and system described above may further include encoding the information bits using an error correction coding scheme. Some examples may further include apply a modulation scheme to the encoded information bits to produce the modulated symbol.

In some examples, the error correction coding scheme comprises a polar encoding scheme.

In some examples, the modulated symbol is based on a pulse-amplitude modulation (PAM) modulation scheme.

In some examples, the modulated symbol is based on a binary phase shift keying (BPSK) modulation scheme.

A method for decoding an error correction code with a neural network is described. Embodiments of the method may preparing a labeled training set comprising ground truth information bits and voltage levels read from a memory device, wherein the voltage levels are based on encoding the ground truth information bits and programming the encoded ground truth information bits to the memory device using a set of modulation symbols, identifying a plurality of conditional probability mass functions based on the labeled training set, wherein each of the conditional probability mass functions describes a voltage level probability for one of the set of modulation symbols, reading a voltage level from a memory device, extracting features from the voltage levels based at least in part on the conditional probability mass functions, apply a neural network decoder to the features to produce predicted information bits, comparing the predicted information bits to the ground truth information bits, and updating the neural network decoder based on the comparison.

An apparatus for decoding an error correction code with a neural network is described. The apparatus may include a processor, memory in electronic communication with the processor, and instructions stored in the memory. The instructions may be operable to cause the processor to prepare a labeled training set comprising ground truth information bits and voltage levels read from a memory device, wherein the voltage levels are based on encoding the ground truth information bits and programming the encoded ground truth information bits to the memory device using a set of modulation symbols, identify a plurality of conditional probability mass functions based on the labeled training set, wherein each of the conditional probability mass functions describes a voltage level probability for one of the set of modulation symbols, read a voltage level from a memory device, extract features from the voltage levels based at least in part on the conditional probability mass functions, apply a neural network decoder to the features to produce predicted information bits, compare the predicted information bits to the ground truth information bits, and update the neural network decoder based on the comparison.

A non-transitory computer readable medium storing code for decoding an error correction code with a neural network is described. In some examples, the code comprises instructions executable by a processor to: prepare a labeled training set comprising ground truth information bits and voltage levels read from a memory device, wherein the voltage levels are based on encoding the ground truth information bits and programming the encoded ground truth information bits to the memory device using a set of modulation symbols, identify a plurality of conditional probability mass functions based on the labeled training set, wherein each of the conditional probability mass functions describes a voltage level probability for one of the set of modulation symbols, read a voltage level from a memory device, extract features from the voltage levels based at least in part on the conditional probability mass functions, apply a neural network decoder to the features to produce predicted information bits, compare the predicted information bits to the ground truth information bits, and update the neural network decoder based on the comparison.

Some examples of the method, apparatus, non-transitory computer readable medium, and system described above may further include computing a gradient of a cross entropy of the predicted information bits and the ground truth information bits, wherein the comparison is based on the gradient of the cross entropy.

In some examples, the voltage level read from the memory device corresponds to a noisy version of a symbol from the set of modulated symbols.

Some examples of the method, apparatus, non-transitory computer readable medium, and system described above may further include encoding the ground truth information bits using an error correction coding scheme. Some examples may further include apply a modulation scheme to the encoded ground truth information bits to produce modulated symbols, wherein the voltage levels are based on the modulated symbols.

In some examples, the error correction coding scheme comprises a polar encoding scheme.

Some examples of the memory device and method described above may further include an encoding component configured to encode information bits to produce the encoded information bits. Some examples may further include a modulation component configured to modulate the encoded information bits.

Some examples of the memory device and method described above may further include a scaling component configured to scale output of the modulation component based on a dynamic voltage range of the memory cells.

In some examples, the neural network decoder comprises one or more fully connected multi-layer perceptron (MLP) layers.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ.

Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method for error correction, comprising:
   receiving a signal from a physical channel, wherein the signal is based on a modulated symbol representing information bits encoded using an error correction coding scheme, wherein the physical channel comprises a NAND memory device;
   extracting features from the signal using a feature extractor trained using probability data collected from the physical channel; and
   decoding the information bits with a neural network decoder taking the extracted features as input.

2. The method of claim 1, further comprising:
   detecting voltage levels from the NAND memory device, wherein the detected voltage levels comprise a noisy realization of the modulated symbol.

3. The method of claim 1, wherein:
   the modulated symbol comprises channel input to the NAND memory device, and the signal comprises a channel output from the NAND memory device.

4. The method of claim 1, wherein:
   the probability data collected from the physical channel comprises one or more probability mass functions.

5. The method of claim 1, wherein:
   the probability data does not assume an additive Gaussian white noise (AWGN) model.

6. The method of claim 1, further comprising:
   programming test symbols to a NAND memory device; and
   detecting voltage levels of the NAND memory device, wherein the probability data is based on a conditional probability of detecting the voltage levels given each of the test symbols.

7. The method of claim 1, further comprising:
   encoding the information bits using an error correction coding scheme; and
   apply a modulation scheme to the encoded information bits to produce the modulated symbol.

8. A method for training a neural network for error correction, comprising:
   preparing a labeled training set comprising ground truth information bits and voltage levels read from a memory device, wherein the voltage levels are based on encoding the ground truth information bits and programming the encoded ground truth information bits to the memory device using a set of modulation symbols;
   identifying a plurality of conditional probability mass functions based on the labeled training set, wherein each of the conditional probability mass functions describes a voltage level probability for one of the set of modulation symbols;
   reading a voltage level from the memory device;
   extracting features from the voltage levels based at least in part on the conditional probability mass functions;
   apply a neural network decoder to the features to produce predicted information bits;
   comparing the predicted information bits to the ground truth information bits; and
   updating the neural network decoder based on the comparison.

9. The method of claim 8, further comprising:

computing a gradient of a cross entropy of the predicted information bits and the ground truth information bits, wherein the comparison is based on the gradient of the cross entropy.

10. The method of claim 8, wherein:

the voltage level read from the memory device corresponds to a noisy version of a symbol from the set of modulated symbols.

11. The method of claim 8, further comprising:

encoding the ground truth information bits using an error correction coding scheme; and apply a modulation scheme to the encoded ground truth information bits to produce modulated symbols, wherein the voltage levels are based on the modulated symbols.

12. The method of claim 11, wherein:

the error correction coding scheme comprises a polar encoding scheme.

13. A memory device, the memory device comprising:

a plurality of memory cells configured to store encoded information bits;

a feature extractor configured to extract features from read voltage levels based on probability data collected for the memory device; and a neural network decoder configured to decode the encoded information bits using the extracted features as input, wherein the neural network decoder comprises one or more fully connected multi-layer perceptron (MLP) layers.

14. The memory device of claim 13, further comprising:

an encoding component configured to encode information bits to produce the encoded information bits; and a modulation component configured to modulate the encoded information bits.

15. The memory device of claim 14, further comprising:

a scaling component configured to scale output of the modulation component based on a dynamic voltage range of the memory cells.

\* \* \* \* \*